(12) United States Patent
Matsushima et al.

(10) Patent No.: US 6,905,757 B2
(45) Date of Patent: Jun. 14, 2005

(54) DIELECTRIC FILLER CONTAINING RESIN FOR USE IN FORMATION OF BUILT-IN CAPACITOR LAYER OF PRINTED WIRING BOARD AND DOUBLE-SIDED COPPER CLAD LAMINATE WITH DIELECTRIC LAYER FORMED USING THE SAME DIELECTRIC FILLER CONTAINING RESIN, AND PRODUCTION METHOD OF DOUBLE-SIDED COPPER CLAD LAMINATE

(75) Inventors: Toshifumi Matsushima, Ageo (JP); Hideaki Miwa, Ageo (JP); Akira Ichiryu, Ageo (JP); Kazuhiro Yamazaki, Ageo (JP); Tetsuro Sato, Ageo (JP); Fujio Kuwako, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 38 days.

(21) Appl. No.: 10/478,419

(22) PCT Filed: Apr. 1, 2003

(86) PCT No.: PCT/JP03/04172
§ 371 (c)(1),
(2), (4) Date: Nov. 21, 2003

(87) PCT Pub. No.: WO03/082977
PCT Pub. Date: Oct. 9, 2003

(65) Prior Publication Data
US 2004/0147658 A1 Jul. 29, 2004

(30) Foreign Application Priority Data
Apr. 2, 2002 (JP) .......................... 2002-099601

(51) Int. Cl.⁷ ................................ B32B 3/00
(52) U.S. Cl. ............... 428/209; 174/258; 361/321.1; 361/321.5; 427/214; 427/221; 427/222
(58) Field of Search .................. 428/209, 901; 174/258; 361/321.1, 321.5; 427/214, 221, 222

(56) References Cited

U.S. PATENT DOCUMENTS

| | | | | |
|---|---|---|---|---|
| 5,707,729 A | * | 1/1998 | Satoh | 428/344 |
| 6,187,416 B1 | * | 2/2001 | Satoh et al. | 428/309 |
| 6,562,179 B1 | * | 5/2003 | Ikeguchi et al. | 156/307.5 |
| 6,693,793 B2 | * | 2/2004 | Kuwako et al. | 361/323 |

FOREIGN PATENT DOCUMENTS

| | | |
|---|---|---|
| JP | 11-207870 A | 8/1999 |
| JP | 2001-347600 A | 12/2001 |
| JP | 2003-39595 A | 2/2003 |

* cited by examiner

Primary Examiner—Cathy F. Lam
(74) Attorney, Agent, or Firm—Rothwell, Figg, Ernst & Manbeck, P.C.

(57) ABSTRACT

An object is to provide a dielectric layer of a double-sided copper clad laminate, for use in formation of a built-in capacitor layer, which can be formed in an optional thickness without using a skeletal material and is provided with a high strength. For the purpose of achieving the object, "a dielectric filler containing resin for use in formation of the built-in capacitor layer of a printed wiring board obtained by mixing a binder resin comprising 20 to 80 parts by weight of epoxy resin (inclusive of a curing agent), 20 to 80 parts by weight of a solvent soluble aromatic polyamide resin polymer, and a curing accelerator added in an appropriate amount according to need; and a dielectric filler which is a nearly spherical dielectric powder having perovskite structure which is 0.1 to 1.0 μm in the average particle size $D_{IA}$, 0.2 to 2.0 μm in the weight cumulative particle size $D_{50}$ based on the laser diffraction scattering particle size distribution measurement method, and 4.5 or less in the coagulation degree represented by $D_{50}/D_{IA}$ where the weight cumulative particle size $D_{50}$ and the average particle size $D_{IA}$ obtained by the image analysis"; and the like are used.

9 Claims, 4 Drawing Sheets

(a) Formation of a dielectric filler containing resin film (b) Drying of the dielectric filler containing resin film (a) Formation of a dielectric filler containing resin film (b) Drying of the dielectric filler containing resin film (c) Press processing (a) Formation of a dielectric filler containing resin film (5 μm or less in thickness)

(b) Drying of the dielectric filler containing resin film (c) Re-formation of a dielectric filler containing resin film (d) Drying of the re-formed dielectric filler containing resin film

DIELECTRIC FILLER CONTAINING RESIN FOR USE IN FORMATION OF BUILT-IN CAPACITOR LAYER OF PRINTED WIRING BOARD AND DOUBLE-SIDED COPPER CLAD LAMINATE WITH DIELECTRIC LAYER FORMED USING THE SAME DIELECTRIC FILLER CONTAINING RESIN, AND PRODUCTION METHOD OF DOUBLE-SIDED COPPER CLAD LAMINATE

CROSS REFERENCE TO RELATED APPLICATION

This application is a 35 USC § 371 National Phase Entry Application from PCT/JP03/04172 filed Apr. 1, 2003, and designating the U.S.

TECHNICAL FIELD

The present invention relates to a dielectric filler containing resin for use in the formation of a built-in capacitor layer of a printed wiring board, a double-sided copper clad laminate in which a dielectric layer is formed by using the dielectric filler containing resin, and a production method of the double-sided copper clad laminate.

BACKGROUND ART

In these years, it has become general practice that a capacitor structure is formed by using a copper clad laminate in a printed wiring board, in particular, in the internal layer portion of a multilayer printed wiring board, in a manner similar to that in circuit shape formation, and the capacitor structure thus formed is utilized as a built-in capacitor. The formation of a capacitor structure in the internal layer portion of a multilayer printed wiring board has permitted omitting the capacitors arranged on the external layer surface, and hence the miniaturization and high densification of the external layer circuits has become possible so that the number of the parts mounted on the surface is reduced and the production of a wiring board provided with fine pitch circuits becomes easier.

A capacitor structure is produced by use of a copper clad laminate as follows: a double-sided copper clad laminate comprising respective copper foil layers on both sides and a dielectric layer interposed therebetween is used, the copper foil layers on both sides are subjected to etching processing to form desired shapes of capacitor electrodes, and the capacitor structure having the dielectric layer sandwiched by the capacitor electrodes on both side is formed in a target position.

The capacitor is demanded to have an electric capacity as large as possible as a fundamental quality thereof. The capacity (C) of a capacitor is derived from the formula $C = \varepsilon \varepsilon_0 (A/d)$ ($\varepsilon_0$ is the dielectric constant of vacuum). Accordingly, for the purpose of increasing the capacity of a capacitor, any one of the following procedures has only to be adopted: <1> the surface area (A) of the capacitor electrode is made larger, <2> the thickness (d) of the dielectric layer is made thinner, and <3> the specific dielectric constant ($\varepsilon$) of the dielectric layer is made larger.

However, as far as the surface area (A) described above in <1> is concerned, it is hardly possible to make the area of the capacitor electrode larger in a certain constrained area of a printed wiring board because a printed wiring board is demanded to be lighter and more compact in conformity with the recent trend that electronic and electric appliances are being made lighter and more compact. As for the thickness (d) of the dielectric layer to be made thinner as described above in <2>, if the dielectric layer contains a skeletal material such as glass cloth as represented by prepreg, a limit is given to the formation of a thinner layer by the presence of the skeletal material. On the other hand, if the skeletal material is merely omitted while using a conventional dielectric layer constituting material, an inconvenience occurs that a copper layer is destructed in a portion of the dielectric layer where the copper foil is removed by etching, through the shower pressure of the etching solution that is used in etching for forming a capacitor electrode. In view of these circumstances, it has become general to adopt a procedure in which the specific dielectric constant ($\varepsilon$) of the dielectric layer is made larger as described above in <3>.

In other words, the increase of the electric capacity of a capacitor has been intended to be actualized in the following way: in the construction of the dielectric layer, a skeletal material such as glass cloth is taken to be indispensable and accordingly the skeletal material is made to be an unwoven material so that the skeletal material may be made thinner and hence the thickness of the whole dielectric layer may also be made thinner, and a resin, in which a dielectric filler is dispersed to be contained therein, is used as the material constituting the dielectric layer.

However, further larger increase of the capacity of the built-in capacitor comes to be demanded. In order to achieve the large increase of the electric capacity, many studies have been developed on the dielectric fillers used as the constituent materials for dielectric materials; the constituent materials for a built-in capacitor have been demanded in which the thickness of the dielectric layer can be adjusted optionally while the skeletal material contained in the dielectric layer is omitted.

Additionally, as a problem associated with the moisture absorption of the dielectric layer, generation of the migration phenomenon can be quoted. The migration phenomenon in a dielectric layer containing a skeletal material refers to a phenomenon that the copper component of the copper plating layer in the print wiring board and the metallic component constituting the dielectric filler diffuse to migrate electrophoretically along the interface between the skeletal material and the resin layer and thus causes inconvenience of short circuiting between neighboring circuits. It is conceivable that the presence of the skeletal material makes such a phenomenon occur easily. Still more, this is because a resin, in which a dielectric filler is dispersed with a fairly high filling factor, is used in the layer used as the dielectric layer.

In view of the above circumstances, a dielectric filler containing resin for use in formation of the built-in capacitor layer in the print wiring board and a dielectric filler powder to be dispersed therein have been demanded, where the dielectric layer, in a copper clad laminate, for use in formation of the built-in capacitor layer does not contain a skeletal material, can be formed in an optional thickness, and has a strength sufficient to prevent the destruction thereof caused by the shower pressure of the etching solution at the time of etching.

BRIEF DESCRIPTION OF THE DRAWINGS

Each of FIGS. 1 to 4 shows schematic sectional views illustrating the production flow of the double-sided copper clad laminate for use in formation of a built-in capacitor layer in a printed wiring board. For the reference numerals and characters in the respective figures, common reference numerals and characters are used; reference numeral 1 denotes a double-sided copper clad laminate, reference numeral 2 denotes a first copper foil, reference numeral 3 denotes a nodularized surface, reference numeral 4 denotes a dielectric filler containing resin film, reference numeral 5 denotes a dielectric layer, reference numeral 6 denotes a second copper foil, and reference character F denotes a dielectric filler. Incidentally, the sectional thickness in each drawing does not reflect the actual product thickness, but is depicted in an exaggerated manner enabling an easy understanding of the explanation.

SUMMARY OF THE INVENTION

Figure 1:
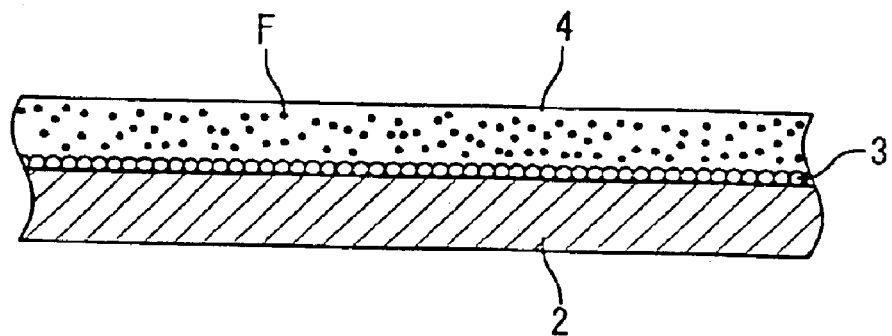
Figure 1:
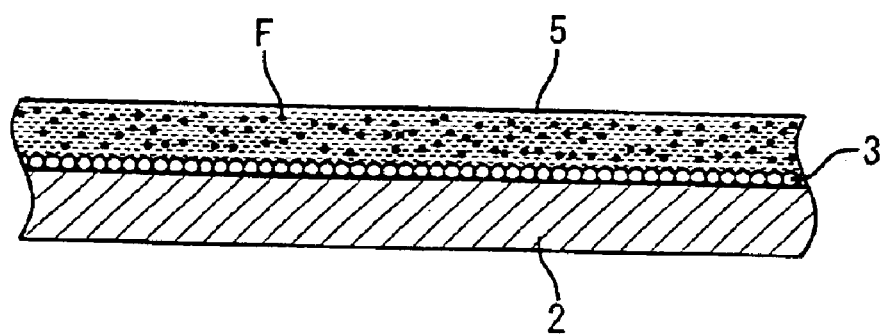

As a result of diligent study, the present inventors have thought out that the use of a dielectric filler containing resin and a dielectric filler powder, for use in formation of a built-in capacitor layer in a printed wiring board, makes it possible to form a dielectric layer provided with sufficient strength and dielectric constant even under omission of a skeletal material.

Dielectric filler containing resin: In the claim section, described is a dielectric filler containing resin for use in formation of a built-in capacitor layer of a printed wiring board, which is characterized in that a dielectric filler containing resin comprises a binder resin and a dielectric filler, in which the binder resin comprises 20 to 80 parts by weight of epoxy resin (inclusive of a curing agent), 20 to 80 parts by weight of a solvent soluble aromatic polyamide resin polymer, and a curing accelerator added in an appropriate amount according to need; and the dielectric filler is a nearly spherical dielectric powder having perovskite structure which has an average particle size $D_{IA}$ of 0.1 to 1.0 $\mu$m, a weight cumulative particle size $D_{50}$ of 0.2 to 2.0 $\mu$m based on the laser diffraction scattering particle size distribution measurement method, and a coagulation degree of 4.5 or less represented by $D_{50}/D_{IA}$ where the weight cumulative particle size $D_{50}$ and the average particle size $D_{IA}$ obtained from image analysis are used.

In the first place, description will be made below on the binder resin. The binder resin utilized in the present invention comprises epoxy resin, a curing agent, a solvent soluble aromatic polyamide resin polymer, and a curing accelerator added in an appropriate amount according to need.

The "epoxy resin" utilized in the present invention is the one that has at least two or more epoxy groups in a molecule, and for which any type of epoxy resin that can be utilized for use in electric/electronic materials can be utilized without any particular problem. Among others, it is preferable to utilize one type or two or more types as a mixture selected from the group consisting of bisphenol-A type epoxy resin, bisphenol-F type epoxy resin, bisphenol-S type epoxy resin, novolac type epoxy resin, cresol novolac type epoxy resin, alicyclic epoxy resin, brominated epoxy resin, and glycidyl amine type epoxy resin.

The epoxy resin constitutes the main part of the binder resin for use in molding the dielectric filler into a dielectric layer shape, and is used in blending ratios ranging from 20 parts by weight to 80 parts by weight. More specifically, the blending ratios are assumed to involve the curing agent described below. Accordingly, when the content of the epoxy resin in a state containing the curing agent is less than 20 parts by weight, the thermocuring property cannot be fully displayed so that the function as the binder for the dielectric filler and the adhesiveness to the copper foil cannot be fully displayed, while when the content of the epoxy resin exceeds 80 parts by weight, the viscosity obtained when the binder resin solution is prepared becomes too high so that the dielectric filler as powder can hardly be dispersed uniformly, and additionally, the balance in relation to the addition amount of the below described aromatic polyamide resin polymer cannot be established and hence no sufficient toughness after curing can be obtained.

The "curing agent" for the epoxy resin includes dicyandiamide, imidazoles, amines such as aromatic amines, phenols such as bisphenol A and brominated bisphenol A, novolacs such as phenol novolac resin and cresol novolac resin, and acid anhydride such as phthalic anhydride. The addition amount of the curing agent in relation to the epoxy resin can be derived from the respective equivalent weights without using any special procedure so that no exact and explicit description of the blending ratio thereof is conceivably necessary. Accordingly, in the present invention, no particular limit is provided for the addition amount of the curing agent.

In the next place, "the aromatic polyamide resin polymer" means a polymer obtained from the reaction of the aromatic polyamide resin and a rubber resin. Here, the aromatic polyamide resin is the resin synthesized by condensation polymerization of an aromatic diamine and a dicarboxylic acid. The aromatic diamine concerned includes 4,4'-diaminodiphenylmethane, 3,3'-diaminodiphenylsulfone, m-xylenediamine, and 3,3'-oxydianiline. Additionally, the used dicarboxylic acid includes phthalic acid, isophthalic acid, terephthalic acid, and fumaric acid.

The rubber resin to be reacted with the aromatic polyamide resin is described as the concept covering natural rubber and synthetic rubber; the latter synthetic rubber includes styrene-butadiene rubber, butadiene rubber, butyl rubber, and ethylene-propylene rubber. Furthermore, when the heat resistance is intended to be secured for the dielectric layer being formed, it is useful to use selectively such heat resistant synthetic rubbers as nitrile rubber, chloroprene rubber, silicon rubber, and urethane rubber. As for these rubber resins, the rubber resins are made to be reacted with the aromatic polyamide resins to produce copolymers, and accordingly it is desirable that the rubber resins are provided with various functional groups at both ends.

The aromatic polyamide resin and rubber resin, both to constitute the aromatic polyamide resin polymer, are preferably used in the blending content of 25 wt % to 75 wt % for the aromatic polyamide resin and in the blending content balance for the rubber resin. With the blending content of the aromatic polyamide resin less than 25 wt %, the content of the rubber component becomes too large and the aromatic polyamide resin polymer becomes poor in heat resistance, while with the blending content of the aromatic polyamide resin exceeding 75 wt %, the content of the aromatic polyamide resin becomes too large and the hardness of the dielectric layer after curing becomes too high and hence the dielectric layer becomes brittle. The aromatic polyamide resin polymer is used for the purpose of securing the sufficient strength of the dielectric layer, in the finally formed double-sided copper clad laminate, to prevent the damage thereof even under the influence of the shower pressure of the etching solution when the copper foil of the double-sided copper clad laminate is subjected to etching processing The aromatic polyamide resin polymer is required to have the characteristic of being solvent soluble. The below described binder resin solution is prepared, and the dielectric filler is dispersed in the solution to prepare a dielectric containing resin solution; since the content of the dielectric filler is larger than the content of the binder resin, there is found a small amount of the binder resin solution between the individual dielectric filler powders. In this connection, if the aromatic polyamide resin polymer component is solvent soluble, the aromatic polyamide resin polymer is dispersed efficiently and uniformly in the binder resin solution and the maldistribution of the aromatic polyamide resin polymer can be prevented.

Additionally, the aromatic polyamide resin polymer is used in the blending content ranging from 20 parts by weight to 80 parts by weight. With the blending content of the aromatic polyamide resin polymer less than 20 wt %, the dielectric layer formed by curing under the general press condition as applied to the copper clad laminate production cannot withstand the shower pressure of the etching solution. On the other hand, the addition of the aromatic polyamide resin polymer with the blending content exceeding 80 wt % does not lead to any particular adverse effect; the addition of the aromatic polyamide resin polymer with the blending content up to 80 wt % contributes to the increase in the strength of the finally obtained dielectric layer, but the addition with the blending content exceeding 80 wt % results in no further increase in the strength of the dielectric layer. Accordingly, in view of the economy, the blend content of 80 wt % can be said to be the upper limit.

"The curing accelerator added in an appropriate amount according to need" includes tertiary amines and imidazole. The present invention does not set any limit to the blending ratio of the curing accelerator. This is because addition amount of the curing accelerator can be determined by the person in charge of production by taking account of the production conditions in the production process of the copper clad laminate.

The dielectric filler is made to be present in the dielectric layer in a dispersed state, and is used finally for the purpose of increasing the electric capacity of the capacitor when processed into a capacitor shape. As the dielectric filler, used are the dielectric powders of such composite oxides having perovskite structure as $BaTiO_3$, $SrTiO_3$, $Pb(Zr—Ti)O_3$ (common name: PZT), $PbLaTiO_3.PbLaZrO$ (common name: PLZT) and $SrBi_2Ta_2O_9$ (common name: SBT).

The powder characteristic of the dielectric filler is such that in the first place the particle size is needed to fall in the range from 0.1 to 1.0 $\mu$m. The particle size as referred to here is the average particle size obtained from the image analysis of the scanning electron microscope (SEM) image taken by directly observing the dielectric filler with a SEM; in the dielectric filler, the individual powder particles mutually form a certain secondary coagulation state so that indirect measurements in which the average particle size is estimated from the values measured with the laser diffraction scattering particle size distribution measurement method, the BET method and the like, cannot be used because the precision is degraded. In the present specification, the particle sizes thus obtained are represented by $D_{IA}$. Incidentally, in the present specification, the image analysis for the dielectric filler powder observed (a magnification of 1,000 to 2,000 times is most preferably adopted) with a scanning electron microscope (SEM) was made using an apparatus IP-1000PC manufactured by Asahi Engineering Co. Ltd., with which the average particle sizes $D_{IA}$ were obtained by conducting the circular particle analysis under the conditions that the circularity threshold was 10 and the overlap degree was 20.

Furthermore, it is required that the dielectric filler powder is a nearly spherical dielectric powder having perovskite structure which is 0.2 to 2.0 $\mu$m in the weight cumulative particle size $D_{50}$ based on the laser diffraction scattering particle size distribution measurement method, and is 4.5 or less in the coagulation degree represented by $D_{50}/D_{IA}$ where the weight cumulative particle size $D_{50}$ and the average particle size $D_{IA}$ obtained from the image analysis are used.

The weight cumulative particle size $D_{50}$ based on the laser diffraction scattering particle size distribution measurement method is the particle size obtained for the weight cumulation of 50% with the laser diffraction and scattering size distribution measurement method; the smaller is the weight cumulative particle size $D_{50}$, the larger is the fraction of the fine powder particles in the particle size distribution of the dielectric filler powder. In the present invention, this value is required to be 0.2 $\mu$m to 2.0 $\mu$m. In other words, when the value of the weight cumulative particle size $D_{50}$ is smaller than 0.2 $\mu$m, the progress of the coagulation is remarkable so that the below mentioned coagulation degree cannot be satisfied irrespective as to what production method is applied to produced the dielectric filler powder. On the other hand, when the value of the weight cumulative particle size $D_{50}$ exceeds 2.0 $\mu$m, the use thereof as the dielectric filler for use in formation of the built-in capacitor in a printed wiring board, which is an object of the present invention, becomes impossible. In other words, the dielectric layer, used for formation of the built-in capacitor layer, of a double-sided copper clad laminate is usually 10 $\mu$m to 25 $\mu$m in thickness so that the upper limit becomes 2.0 $\mu$m for the purpose of dispersing the dielectric filler uniformly in the above described dielectric layer.

The measurement of the weight cumulative particle size $D_{50}$ in the present invention was conducted as follows: the dielectric filler powder was mixed and dispersed in methyl ethyl ketone, the solution thus obtained was injected for measurement into the circulation device of a laser diffraction scattering particle size distribution measurement apparatus, Micro Trac HRA 9320-X100 (manufactured by Nikkiso Co., Ltd.)

The concept of the coagulation degree utilized here is adopted on the following grounds. The weight cumulative particle size $D_{50}$ value obtained by use of the laser diffraction scattering particle size distribution measurement method can be regarded as different from the actual individual particle sizes of the powder particles directly observed one by one. This is because most of the powder particles constituting a dielectric powder are not so-called monodisperse particles which are completely separated from each other, but are in a aggregation state in which a plurality of powder particles are coagulated. The laser diffraction scattering particle size distribution measurement method can be said to recognize a group of coagulated particles as one particle (coagulation particle) for derivation of the weight cumulative particle size.

On the contrary, because the average particle size $D_{IA}$, obtained through image processing of the dielectric powder image observed by use of a scanning electron microscope, is directly obtained from the SEM observation image, the primary particles are observed without fail, but the $D_{IA}$ value does not reflect the coagulation state of the powder particles at all.

In view of the above consideration, the present inventors have taken the $D_{50}/D_{IA}$ value as the coagulation degree on the basis of the $D_{50}$ obtained from the laser diffraction scattering particle size measurement method and the average particle size $D_{IA}$ derived from the image analysis. In other words, on the assumption that the copper powder specimens obtained from the same lot make it possible to measure the $D_{50}$ and $D_{IA}$ values with the same precision, the theory described above deduces the prediction that the $D_{50}$ value, reflecting the presence of the coagulation state to the measured value, will take a value larger than the $D_{IA}$ value (in the actual measurement, similar results are obtained).

In this case, the $D_{50}$ value, when the coagulation state of the powder particles of the dielectric filler powder is absolutely absent, approaches the $D_{IA}$ value without limitation so that the coagulation degree of the $D_{50}/D_{IA}$ value approaches unity. Thus, at the stage when the coagulation degree takes a value of unity, the powder can be said to be the monodisperse powder in which the coagulation state of the powder particles is absolutely absent. Actually, however, some cases show the coagulation degrees smaller than unity. From the theoretical viewpoint, the coagulation degree does not take a value smaller than unity in the case involving a perfect sphere, but actually the powder particles are not perfect spheres so that the coagulation value smaller than unity may be obtained.

In the present invention, the coagulation degree of the dielectric filler powder is required to be 4.5 or lower. If the coagulation degree exceeds 4.5, the level of the mutual coagulation between the individual particles of the dielectric filler powder becomes too high so that the uniform mixing of the dielectric filler powder with the above described binder resin becomes difficult.

Even if any production method of the alkoxide method, the hydrothermal synthesis method, the oxalate method and the like is adopted as the production method of the dielectric filler, a certain coagulation state is inevitably formed, and accordingly such dielectric filler powder that does not satisfy the above described coagulation degree is possibly generated. Particularly, in the case of the hydrothermal synthesis method that is a wet method, the coagulation state formation tends to be generated. In this connection, it is possible to make the coagulation state of the dielectric filler powder attain the above described range of coagulation degree, by conducting a disintegration treatment in which the powder in a coagulation state is disintegrated into individual powder particles.

If the object is the mere disintegration operation, the following various means capable of disintegration can be applied: a high energy ball mill, a high speed conductor collision airflow disintegrator, a collision disintegrator, a gauge mill, a medium stirring disintegrator, a high hydraulic pressure disintegrator and the like. On the one hand, for the purpose of ensuring the mixability and dispersibility between the dielectric filler powder and the binder resin, it is necessary to take account of the below described viscosity reduction of the dielectric filler containing resin solution. For the purpose of reducing the viscosity of the dielectric filler containing resin solution, it is required that the dielectric filler powder be made small in specific surface area and smooth. Accordingly, the disintegration method, even if capable of disintegration, should not be a disintegration method which, while disintegration, damages the surface of the powder particles and increases the specific surface area thereof.

As a result of the diligent research performed by the present inventors on the basis of such understanding, two methods have been found to be effective. The fact common to these two methods is that the two methods are sufficiently capable of disintegration in such a way that the contact of the powder particles of the dielectric filler powder onto the parts of the inner wall portion of the apparatus, stirrer blades, disintegration medium and the like, is suppressed to occur to the least extent so that the mutual collision between the coagulated powder particles is made to occur. In other words, the contact onto the parts of the inner wall portion of the apparatus, stirrer blades, disintegration medium and the like leads to damaging the surface of the powder particles, increasing the surface roughness thereof and degrading the sphericity thereof, and hence the contact is prevented. Thus, a method can be adopted in which by making the mutual collision of the power particles occur to a sufficient extent, the powder particles in the coagulation state are disintegrated, and concurrently the surface of the powder particles can be made smooth.

One of the two methods disintegrates the dielectric filler powder in a coagulation state by means of a jet mill. The "jet mill" as referred to here is an apparatus in which a high speed air flow is used, the dielectric filler powder is placed in the high speed air flow, and the mutual collision between the powder particles in the high speed air flow leads to the disintegration operation.

Additionally, a slurry, in which the dielectric filler powder in a coagulation state is dispersed in a solvent capable of maintaining the stoichiometry of the powder, is subjected to the disintegration treatment in which a fluid mill taking advantage of centrifugal force is used. The use of "the fluid mill taking advantage of centrifugal force" as referred to here makes the slurry flow in a high speed so as to depict a circular orbit, and the centrifugal force thus generated makes the coagulated powder particles collide with each other so that the disintegration operation is performed. Thus, the slurry brought to completion of the disintegration is washed, filtered and dried, and consequently the dielectric filler powder brought to completion of the disintegration operation is obtained. In the above described method, the coagulation degree can be adjusted and the powder surface of the dielectric filler powder can be purposefully made smooth.

The dielectric filler containing resin for use in formation of the built-in capacitor layer of a printed wiring board is prepared by mixing together the above described binder resin and dielectric filler. In this connection, it is desirable that the blending ratios of the binder resin and dielectric filler are, as described in the claim section, such that the content of the dielectric filler is 75 wt % to 85 wt % and the content balance is allotted to the binder resin.

With the content of the dielectric filler smaller than 75 wt %, the specific dielectric constant of 20 as demanded at present in the market cannot be met, while with the content of the dielectric filler exceeding 85 wt %, the content of the binder resin becomes smaller than 15 wt % so that the adhesiveness between the dielectric filler containing resin and the copper foil to be clad thereto is degraded, and thus it becomes difficult to produce the copper clad laminate which meets the characteristics demanded for use in producing the printed wiring board.

Additionally, it is preferable to use barium titanate as the dielectric filler, among the composite oxides having perovskite structure, at the present stage, in consideration of the production precision as a powder. As the dielectric filler in this case, either calcined barium titanate or uncalcined barium titanate can be used. When a high dielectric constant is intended to be attained, it is preferable to use calcined barium titanate; according to the quality of design for the printed wiring board product, any of these two can be used selectively.

Additionally, furthermore, it is most preferable that the dielectric filler of barium titanate has cubic crystal structure. Barium titanate has cubic and tetragonal crystal structures; the dielectric filler of barium titanate having cubic crystal structure stabilizes the dielectric constant value of the finally obtained dielectric layer as compared to the case where the dielectric filler of barium titanate having only the tetragonal crystal structure is used. Thus, it can be said that it is necessary to use a barium titanate powder that has simultaneously at least both cubic and tetragonal crystal structures.

A very satisfactory product can be obtained when the dielectric layer in the double-sided copper clad laminate for use in formation of the built-in capacitor layer of a printed wiring board is constituted by use of the dielectric filler containing resin described above. More specifically, the product is a double-sided copper clad laminate for use in formation of the built-in dielectric layer of a printed wiring board, provided with a dielectric layer between the first copper foil layer and the second copper foil layer, which is characterized in that the dielectric layer is formed by use of the dielectric filler containing resin, described in the claim section of the present invention, for use in formation of the built-in capacitor layer of a printed wiring board. A built-in capacitor formed by use of the double-sided copper clad laminate is free in setting the dielectric layer thickness, and has an excellent electric capacity as a result and a high capacitor quality can be achieved.

The production method of the copper clad laminate for use in formation of a capacitor layer (1): Description will be made below on the production method of the copper clad laminate for use in formation of a capacitor layer. The first production method described in the claim section is to be read as "a production method, described in claim 6, of a double-sided copper clad laminate for use in the formation of the built-in capacitor layer of a printed wiring board, which is characterized in that a dielectric filler containing resin solution is prepared according to the below described procedures <1> to <2>, the dielectric filler containing resin solution is applied onto the nodularized surface of a first copper foil in a prescribed thickness, a semicured-state dielectric layer is formed by drying, the nodularized surface of a second copper foil is bonded onto the dielectric layer, and thus a state of a double-sided copper clad laminate is formed in which the dielectric layer is sandwiched between the first copper foil and the second copper foil."

The dielectric filler containing resin solution is prepared according to the following procedures. At the beginning, the procedure <1> prepares a resin mixture of a composition of binder resin by mixing together 20 to 80 parts by weight of epoxy resin (inclusive of a curing agent), 20 to 80 parts by weight of a solvent soluble aromatic polyamide resin polymer and a curing accelerator added in an appropriate amount according to need. The respective explanations for the individual compositions and blending ratios thereof, mentioned here, are omitted because these explanations have been already presented and so the explanations herein become redundant.

Now, the procedure <2> prepares a binder resin solution having a resin solid content of 25 wt % to 40 wt % by dissolving the above described resin mixture by use of an organic solvent such as either any one of methyl ethyl ketone and cyclopentnone or a mixed solvent prepared therefrom. The adoption of methyl ethyl ketone and cylopentanone is based on the fact that these solvents can be easily and efficiently eliminated by evaporation through the thermal history in the press processing for production of the copper clad laminate, additionally the purification treatment of the evaporated gas is easy, and the viscosity of the resin solution can be easily adjusted so as to become most appropriate for application onto the copper foil surface. Incidentally, solvents other than those specified here can be used if the solvents can dissolve all the resin components used in the present invention.

At the present stage, it is most preferable that the dissolution is made by using either any one of methyl ethyl ketone and cyclopentanone or a mixed solvent prepared therefrom. When a mixed solvent is prepared, there is no particular limitation to the mixing ratio; it is preferable that methyl ethyl ketone is used as an accompanying solvent because conceivably cyclopentanone is inevitably mixed in as used in the adjustment varnish for the aromatic polyamide resin polymer, and hence on the assumption that cyclopentanone is inevitably mixed in, the evaporation elimination rate in the thermal history is considered for application to a printed wiring board.

By using the solvents described here, the binder resin solution is made to have the resin solid content of 25 wt % to 40 wt %. The resin solid content range indicated here is the range that can make the film thickness be the best in precision when application is made onto the copper foil surface. With the resin solid content less than 25 wt %, the viscosity becomes too low and accordingly the maldistribution of the powder particles of the dielectric filler powder, added later, tend to occur. On the contrary, with the resin solid content exceeding 40 wt %, the viscosity becomes high and accordingly the dispersibility of the added dielectric filler becomes poor so that uniform mixing becomes difficult.

The procedure <3> prepares a dielectric filler containing resin solution by adding to and mixing with the above described binder resin solution a dielectric powder having perovskite structure. The added dielectric filler is a nearly spherical dielectric powder having perovskite structure which is 0.1 to 1.0 μm in the above described average particle size $D_{IA}$, 0.2 to 2.0 μm in the weight cumulative particle size $D_{50}$ based on the laser diffraction scattering particle size distribution measurement method, and 4.5 or less in the coagulation degree represented by $D_{50}/D_{IA}$ where the weight cumulative particle size $D_{50}$ and the average particle size $D_{IA}$ obtained by the image analysis are used. Accordingly, the explanation for the added dielectric filler is omitted because the explanation becomes redundant.

Description will be made below on the production method with reference to the figures; here, it should be clearly noted that the figures are highly schematic sectional views for the purpose of clear understanding of the explanations, and in particular the thicknesses and sizes do not represent faithfully the values of the actually embodied objects. As FIG. 1(a) shows, the above described dielectric filler containing resin solution is applied onto the nodularized surface 3 of a first copper foil 2 in a prescribed thickness to form a film 4 of the dielectric filler containing resin solution. Here, the nodularized surface 3 of the copper foil is the surface used for bonding to the dielectric layer of a copper clad laminate, and is usually provided with concavities and convexities so as to bite into the resin and display the anchor effect. In the figure, the nodularized surface is depicted as a surface with attached fine copper grains. As for the copper foil used for a copper clad laminate that constitutes a capacitor layer, it is preferable to use a product in which the nodularized surface of a copper foil is as flat as possible, for the purpose of maintaining the dielectric layer thickness to be uniform. Accordingly, it is preferable to use a very low profile (VLP) copper foil, a rolled copper foil and the like. Incidentally, it is the dielectric filler F that is represented by the black points in the figure.

Then, according to the process shown in FIG. 1(b), the film 4 of the dielectric filler containing resin solution applied onto the nodularized surface 3 of the first copper foil 2 is dried, and thus a semicured-state dielectric layer 5 is obtained. For the drying operation in the process, the procedures using air drying, heat drying, or a combination thereof can be adopted, and for the atmosphere for drying, air drying, reduced pressure drying and the like can be optionally adopted in conformity with the process.

On completion of the formation of the semicured-state dielectric layer 5 on the nodularized surface 3 of the first copper foil 2, as described above, the nodularized surface 3 of the second copper foil 6 is made to abut to the surface of the dielectric layer 5 as shown in FIG. 2(c) and then subjected to press processing so that a double-sided copper clad laminate 1 for use in formation of the built-in capacitor layer of a printed wiring board is produced which is in a state that the dielectric layer 5 is sandwiched between the first copper foil 2 and the second copper foil 6 (namely, a structure of the first copper foil layer/dielectric layer/second copper foil layer). Incidentally, at the stage of completing the bonding of the second copper foil 6, the dielectric layer 5 reaches a state in which curing is completed.

The production method of the copper clad laminate for use in formation of a capacitor layer (2): The second production method as described in the claim section is such that "a production method of a double-sided copper clad laminate for use in formation of the built-in capacitor layer of a printed wiring board in which the desired semicured-state dielectric layer having a predetermined thickness is formed in such a way that a 5 $\mu$m or less thick film of the dielectric filler containing resin solution is formed on the nodularized surface of the first copper foil, the film of the dielectric filler containing resin solution is dried and made to be in a semicured state, a 5 $\mu$m or less thick film of the dielectric filler containing resin solution is formed once again on the semicured-state resin film, and the drying operation is repeated."

The production method is the same as the first production method in the preparation method of the dielectric filler containing resin solution, but different from the first production method in the formation method of the dielectric layer 5 by use of the dielectric filler containing resin solution. More specifically, in the above described first production method, as far as the method of applying the dielectric filler containing resin solution for the purpose of forming the dielectric layer is concerned, one operation of applying the dielectric filler containing resin solution onto the nodularized surface of a copper foil in a prescribed thickness is primarily intended. On the contrary, in the second production method, a method is adopted in which the application of the dielectric filler containing resin solution for the purpose of forming the dielectric layer 5 is conducted in a plurality of separate times.

The adoption of such method makes it possible to enhance the dispersion precision of the dielectric-filler in the semicured-state dielectric layer which is formed by drying the resin film of the dielectric filler containing resin solution applied onto the modularized surface of a copper foil. More specifically, a 5 $\mu$m or less thick film 4 of the dielectric filler containing resin solution is formed on the nodularized surface 3 of the first copper foil 2 as FIG. 3(a) shows, the film 4 of the dielectric filler containing resin solution is dried and made to be a semicured-state thin dielectric layer 5a as FIG. 3(b) shows, a 5 $\mu$m or less thick film 4' of the dielectric filler containing resin solution is formed once again on the semicured-state thin dielectric layer 5a according to the process shown in FIG. 4(c), a drying operation is repeated as FIG. 4(d) shows, and thus a desired semicured-state dielectric layer 5 having a predetermined thickness is formed.

Figure 2:
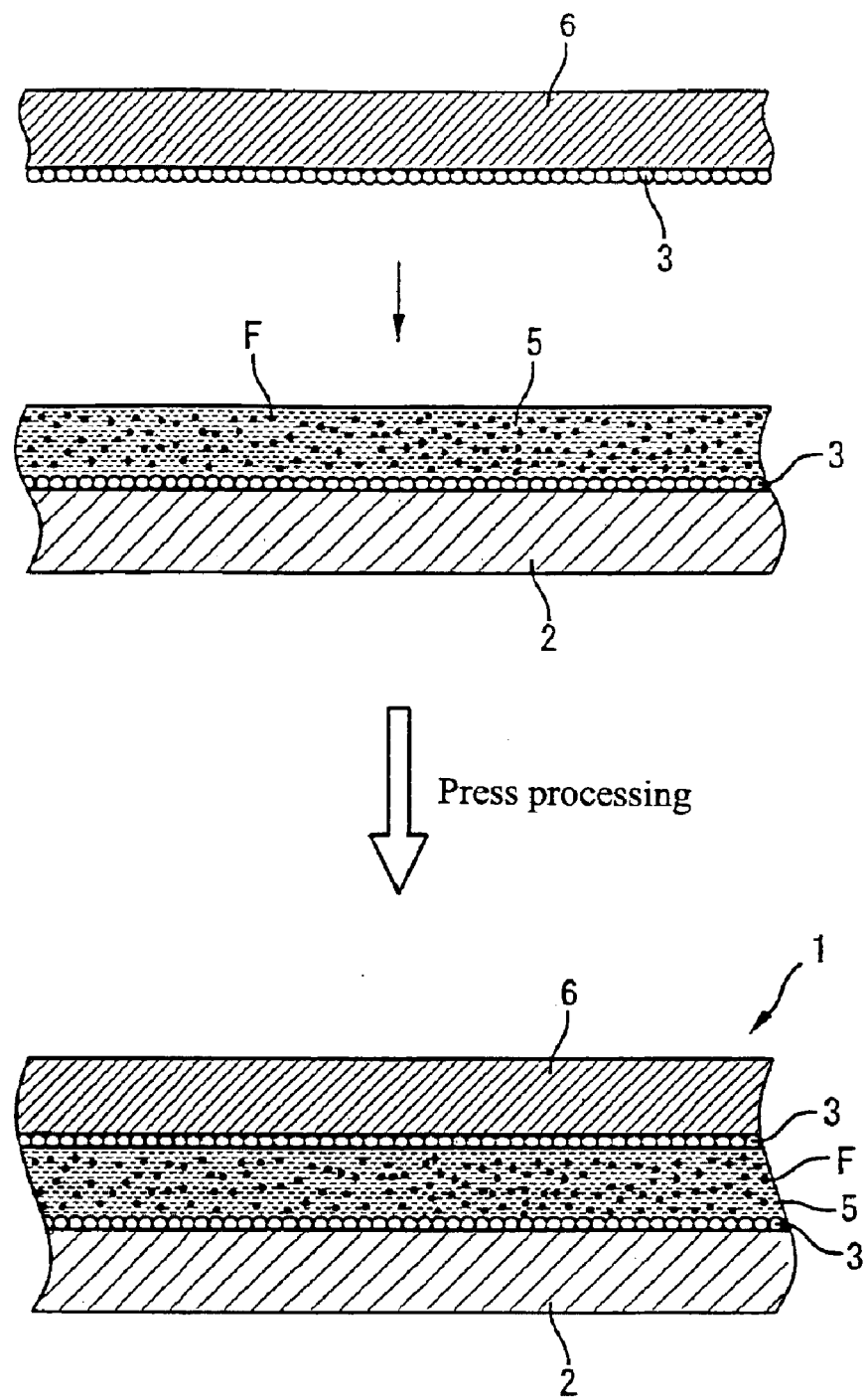

On completion of the formation of the semicured-state dielectric layer 5 of a prescribed thickness, as described above, the nodularized surface 3 of the second copper foil 6 is made to abut to the surface of the dielectric layer 5 according to a method similar to that shown in FIG. 2, and then subjected to press processing so that a double-sided copper clad laminate for use in formation of the built-in capacitor layer of a printed wiring board is produced which is in a state that the dielectric layer 5 is sandwiched between the first copper foil 2 and the second copper foil 6 (namely, a structure of the first copper foil layer/dielectric layer/second copper foil layer).

BEST MODE FOR CARRYING OUT THE INVENTION

Description will be made below on the results of the production of a dielectric filler containing resin for use in formation of a built-in capacitor layer of a printed wiring board and the production of a double-sided copper clad laminate in which a dielectric layer is formed by use of the dielectric filler containing resin.

EXAMPLE 1

In the present example, description will be made with reference to FIGS. 1 and 2. At the beginning, a binder resin solution was produced. In the production of the binder resin solution, the raw material used were 25 parts by weight of phenol novolac type epoxy resin, 25 parts by weight of a solvent soluble aromatic polyamide resin polymer, and BP3225-50P from Nippon Kayaku Co., Ltd. commercially available as a mixed varnish mixed with cyclopentanone as solvent. Additionally, a resin mixture having the blending ratios shown below was prepared by adding a novolac type phenolic resin, MEH-7500 from Meiwa Kasei Co., Ltd., as a curing agent and 2E4MZ from Shikoku Kasei Co., Ltd. as a curing accelerator to the mixed varnish.

| The composition of the binder resin | |
|---|---|
| Phenol novolac type epoxy resin | 39 parts by weight |
| Aromatic polyamide resin polymer | 39 parts by weight |
| Novolac type phenolic resin | 22 parts by weight |
| Curing accelerator | 0.1 parts by weight |

The resin mixture was adjusted to the resin solid content of 30 wt % by further using methyl ethyl ketone to produce the binder resin solution. Then, a barium titanate powder, which is a dielectric filler F having the powder characteristic described below, was mixed and dispersed in the binder resin, and thus a dielectric filler containing resin solution having the composition described below was prepared.

| Powder characteristic of the dielectric filler powder | |
|---|---|
| Average particle size ($D_{IA}$) | 0.25 $\mu$m |
| Weight cumulative particle size ($D_{50}$) | 0.5 $\mu$m |
| Coagulation degree ($D_{50}/D_{IA}$) | 2.0 |
| Dielectric filler containing resin solution | |
| Binder resin solution | 83.3 parts by weight |
| Barium titanate powder | 100 parts by weight |

The dielectric filler containing resin solution produced as described above was applied, using an edge coater, as the process shown in FIG. 1(a), onto the nodularized surface of the first copper foil 2 so as to form a dielectric filler containing resin film 4, air drying was conducted for 5 minutes, then a drying processing was conducted for 3 minutes in a heated atmosphere at 140° C., and thus a semicured-state 20 $\mu$m thick dielectric layer 5, shown in FIG. 1(b), was formed. Incidentally, the first copper foil 2 is a 35 μm thick electrodeposited copper foil which is 2.1 μm in the average nodularity of the noduralized surface 3.

On completion of the formation of the dielectric layer 5, as FIG. 2 shows, the nodularized surface 3 of a second copper foil 6 (an electrodeposited copper foil similar to the first copper foil) was made to abut to the dielectric layer 5 to be laminated, and a hot press molding was conducted under the heating condition of 180° C.×60 minutes to yield the state of the double-sided copper clad laminate 1.

The copper foil layers 2, 6 on both sides of the copper clad laminate 1 produced as described above were regularized, a dry film is bonded to each of both sides to form an etching resist layer. Capacitor circuits are exposed and developed on the etching resist layers on both sides to form the etching patterns. Then, circuit etching was conducted by using a copper chloride etching solution, etching resist peeling was conducted, and thus the capacitor circuits were produced. At the time of etching, there occurred no destruction of the dielectric layer caused by the shower pressure of the etching solution so that a printed wiring board of a satisfactory state was obtained.

Additionally, the specific dielectric constant of the dielectric layers constituting the capacitor circuits was measured to be an extremely satisfactory value of ∈=20, which means that a capacitor of high electric capacity was obtained.

EXAMPLE 2

Figure 3:
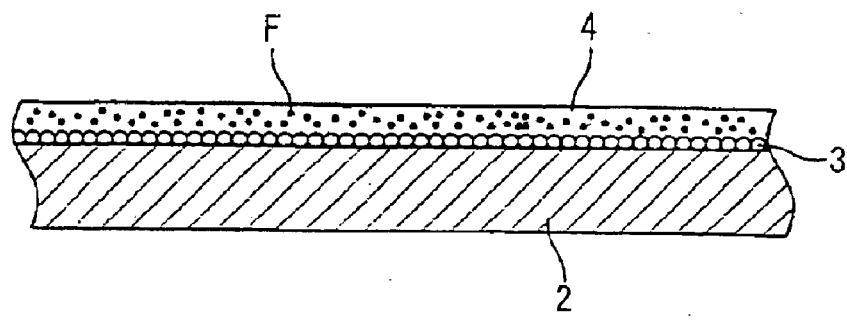
Figure 3:
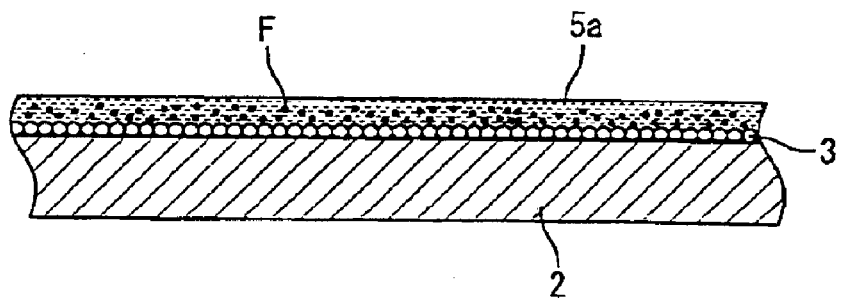
Figure 4:
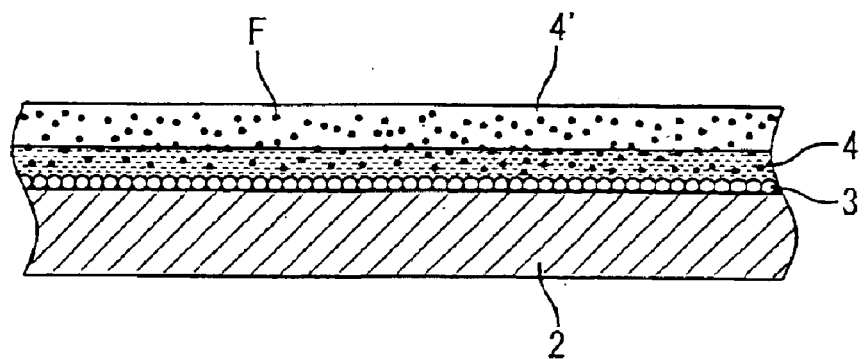
Figure 4:
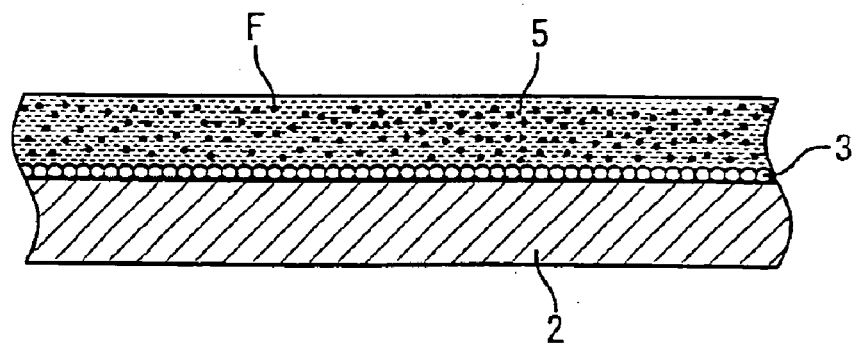

In the present example, description will be made with reference to FIGS. 3 and 4. A dielectric filler containing resin solution was produced by a method similar to that in Example 1. Accordingly, the description for the production method of the dielectric filler containing resin solution is omitted because the description becomes redundant.

In the present example, the dielectric filler containing resin solution was applied, using an edge coater, as the process shown in FIG. 3(a), onto the nodularized surface of the first copper foil 2 so as to form a 5 μm thick dielectric filler containing resin film 4, air drying was conducted for 5 minutes, then a drying processing was conducted for 5 minutes in a heated atmosphere at 150° C., and thus an about 5 μm thick semicured-state dielectric layer 5a, shown in FIG. 3(b), was formed. Additionally, as FIG. 4(c) shows, the application was once again made so as to form a 5 μm thick dielectric filler containing resin film 4 on the first dielectric layer 5a, air drying was conducted for 5 minutes, then a drying processing was conducted for 3 minutes in a heated atmosphere at 140° C. to form the second dielectric layer; by repeating further twice this set of operations, a third dielectric layer and a fourth dielectric layer were formed, and finally, an about 20 μm thick dielectric layer 5, taking a state as shown in FIG. 4(d), was obtained in which the first dielectric layer to the fourth dielectric layer were laminated to be integrated into one piece. The first copper foil 2 used in this case was an electrodeposited copper foil similar to that used in Example 1.

On completion of the formation of the dielectric layer 5 in the above described way, as FIG. 2 shows, the nodularized surface 3 of a second copper foil 6 (an electrodeposited copper foil similar to the first copper foil) was made to abut to the dielectric layer 5 to be laminated, and a hot press molding was conducted under the heating condition of 180° C.×60 minutes to yield the state of the double-sided copper clad laminate 1. Subsequently, in a manner similar to that in Example 1, the capacitor circuits were produced. At the time of etching, there occurred no destruction of the dielectric layer caused by the shower pressure of the etching solution so that a printed wiring board of a satisfactory state was obtained.

Additionally, the specific dielectric constant of the dielectric layers constituting the capacitor circuits was measured to be an extremely satisfactory value of ∈=21, which means that a capacitor of high electric capacity was obtained.

INDUSTRIAL APPLICABILITY

By using a dielectric filler containing resin involved in the present invention, obtained by combining a binder resin and a dielectric filler, the dielectric layer, formed in the interior of a double-sided copper clad laminate for use in formation of a built-in capacitor layer of a printed wiring board, is not destructed by the shower pressure of an etching solution at the time of etching of a circuit, and furthermore a high dielectric constant can be ensured as a capacitor. Among conventional laminates is scarcely found a double-sided copper clad laminate, which has succeeded in making the two characteristics compatible with excellence in total balance, for use in formation of a built-in capacitor layer of a printed wiring board.

What is claimed is:

1. A composition for use in the formation of a built-in capacitor layer of a printed wiring board, comprising:
   a binder resin comprising 20-80 weight % epoxy resin and curing agent and 20-80 weight % of a solvent soluble aromatic polyamide resin polymer; and
   a dielectric filler comprising a nearly spherical dielectric powder having a perovskite structure which is 0.1 to 1.0 mm in average particle size $D_{IA}$, 0.2 to 2.0 mm in weight cumulative particle size $D_{50}$ based on a laser diffraction scattering particle size distribution measurement method, and a coagulation degree value of 4.5 or less, wherein the coagulation degree value is $D_{50}/D_{IA}$.

2. The composition according to claim 1, wherein the aromatic polyamide resin polymer is obtained by reacting an aromatic polyamide with a rubber resin.

3. The composition according to claim 1, wherein the content of the dielectric filler is 75–85 weight % of the total, the binder resin comprising the balance.

4. The composition according to claim 1, wherein the dielectric filler is either calcined barium titanate or uncalcined barium titanate.

5. The composition according to claim 1, wherein the dielectric filler is barium titanate having either a cubic crystal structure or a mixed cubic and tetragonal crystal structure.

6. A double-sided copper clad laminate for use in formation of a built-in capacitor layer of a printed wiring board, comprising:
   a first copper foil layer;
   a second copper foil layer; and
   a dielectric layer formed between the first copper foil layer and the second copper foil layer, wherein the dielectric layer comprises the composition according to claim 1.

7. A method for forming a double-sided copper clad laminate, comprising the steps of:
   forming a composition according to claim 1 by dissolving the binder resin in an organic solvent to form a binder resin solution having a binder resin content of 25-40 weight % and then mixing the binder resin solution with the dielectric filler;
   applying the composition onto a nodular surface of a first copper foil layer and then drying the composition to form a semi-cured dielectric layer; and bonding a nodularized surface of a second copper foil layer onto the semi-cured dielectric layer so that the semi-cured dielectric layer is between the first copper foil layer and the second copper foil layer.

8. A method for forming the double-sided copper clad laminate of claim 6, comprising the steps of:

forming the dielectric layer by applying the composition to a nodularized surface of the first copper foil layer and then drying the composition to form a first semi-cured dielectric layer on the first copper foil layer, and applying the composition to the first semi-cured dielectric layer and then drying the composition to form a second semi-cured dielectric layer on the first semi-cured dielectric layer, wherein each semi-cured dielectric layer has a thickness of 5 μm or less; and bonding a nodularized surface of the second copper foil layer onto the second semi-cured dielectric layer.

9. The composition of claim 1, wherein the binder resin further comprises a curing accelerator.

\* \* \* \* \*

UNITED STATES PATENT AND TRADEMARK OFFICE
CERTIFICATE OF CORRECTION

PATENT NO. : 6,905,757 B2
DATED : June 14, 2005
INVENTOR(S) : Toshifumi Matsushima et al.

It is certified that error appears in the above-identified patent and that said Letters Patent is hereby corrected as shown below:

<u>Column 14,</u>
Line 31, should read as follows:
-- 1.0 $\mu$m in average particle size $D_{1A}$, 0.2 to 2.0 $\mu$m in --.

Signed and Sealed this

Sixth Day of September, 2005

JON W. DUDAS
*Director of the United States Patent and Trademark Office*

UNITED STATES PATENT AND TRADEMARK OFFICE
CERTIFICATE OF CORRECTION

PATENT NO.     : 6,905,757 B2
DATED          : June 14, 2005
INVENTOR(S)    : Toshifumi Matsushima et al.

It is certified that error appears in the above-identified patent and that said Letters Patent is hereby corrected as shown below:

Column 14,
Line 31, should read as follows:
-- 1.0 $\mu$m in average particle size $D_{IA}$, 0.2 to 2.0 $\mu$m in --.

This cerificate supersedes Certificate of Correction issued September 6, 2005.

Signed and Sealed this

Sixth Day of December, 2005

JON W. DUDAS
*Director of the United States Patent and Trademark Office*